United States Patent [19]

Kuo

[11] 4,316,942
[45] Feb. 23, 1982

[54] THICK FILM COPPER CONDUCTOR CIRCUITS

[75] Inventor: Charles C. Y. Kuo, Elkhart, Ind.

[73] Assignee: CTS Corporation, Elkhart, Ind.

[21] Appl. No.: 194,477

[22] Filed: Oct. 6, 1980

[51] Int. Cl.$^3$ .................. B32B 15/20; B05D 5/12; H01C 1/012
[52] U.S. Cl. .................. 428/432; 338/307; 338/314; 427/96; 427/101; 427/102; 427/103; 428/457; 428/469; 428/901
[58] Field of Search .............. 428/457, 101, 469, 432, 428/426; 427/103, 96, 101; 338/307, 314

[56] References Cited

U.S. PATENT DOCUMENTS

| | | | |
|---|---|---|---|
| 3,998,980 | 12/1976 | Antes et al. | 427/103 |
| 4,140,817 | 2/1979 | Brown | 427/96 |
| 4,255,291 | 3/1981 | Needes et al. | 428/430 |

Primary Examiner—Thomas J. Herbert, Jr.
Attorney, Agent, or Firm—John A. Young; Larry J. Palguta

[57] ABSTRACT

A method for producing a thick film circuit (30) including a copper conductor pattern (19), thereby obviating the need for expensive precious metal compositions. In the process, a fritted copper paint (16) is applied to a ceramic substrate (18) and fired at a temperature of 850° C. to 950° C. and is oxidized. Concurrently, the paint (16) is adhesively joined to the nonreactive and nonconductive ceramic substrate (18). Next, a resistor paint (20) is applied in overlapping relationship with the air-heated copper conductor pattern (19) and fired at 850° C. to 950° C. The entire unit is then fired in a reducing atmosphere at a temperature of 260° C. to 450° C. to reduce the oxidized copper. The air-fired resistor pattern (21) can either be protected by a coating (40) or unprotected during the reducing atmosphere firing. The essential ingredients of the copper paint (16) are a frit (12) that is non-reducible under a hydrogen atmosphere, a copper powder (10) and a suitable screening agent (14).

In this new and improved three-step firing process, the copper conductors are compatible with existing ruthenium base resistors.

8 Claims, 4 Drawing Figures

THICK FILM COPPER CONDUCTOR CIRCUITS

DESCRIPTION

1. Technical Field

This invention relates to thick film conductors which circumvent the requirement for precious metal conductors. Thus, less expensive or readily available copper is utilized as the conductor, and such material when printed onto a substrate, is useable with a ruthenium resistor which was previously incompatible with a copper conductor.

2. Background Art

A method of producing nonprecious metal thick film conductors on substrates and combining such thick film conductors with ruthenium base resistors has proved difficult to obtain. The use of a nonprecious metal paste such as a commercially available copper paste which includes a glass frit, requires firing in an atmosphere of nitrogen, and such processing is incompatible with a ruthenium base resistor because of (1) interface problems such as separation, and (2) because of extremely large unpredictable changes in the fired resistance values. The art has, of course, sought diligently to obviate the necessity for expensive precious metal conductors which have a resistivity to oxidization during firing.

In an effort to find a substitute for these precious metals, attention has been given to the use of copper base metal conductors with existing ruthenium base resistors but the effort has been complicated by the fact that copper will oxidize at those temperatures which are necessary to effect bonding between the copper conductor network and the surface of the substrate. Also, the ruthenium base resistor network is fired under oxidizing conditions which causes the copper to oxidize and thus adversely affect the conductor properties.

One of the proposals for utilizing the combination of a copper conductor and ruthenium resistor is proposed in U.S. Pat. No. 4,140,817, "THICK FILM RESISTOR CIRCUITS," issued Feb. 20, 1979 to John F. Brown. This patent discloses both a method and product for making thick film conductors utilizing a copper conductor and ruthenium oxide resistance. The method and resulting product is obtained by applying a copper paste or paint that is fritless onto a substrate and firing the copper to the temperature and for a time necessary to effect bonding to the substrate and experiencing, of course, the usual oxidization of the copper. The copper oxide in the circuit pattern is then reduced, the resistor material is thereafter deposited and fired in an oxidizing atmosphere and finally the low-density copper oxide is reduced at a sufficiently low temperature so that the resistor properties of the ruthenium oxide are not materially affected. The present invention proposes to materially improve upon the previous thick film resistor circuits by utilizing a copper powder together with a glass frit and a screening agent which is painted onto a ceramic substrate, and fired under atmospheric conditions so that even though the copper oxidizes, it becomes bonded to the substrate. Thereafter, there needs only to be painted on the substrate the resistor circuits in the form of ruthenium oxide or its equivalent, and then fired, and then the combination is again heated under reducing atmosphere at 260° C. to 450° C.

In this manner, there is substantially reduced a number of steps which are required to form a thick film conductor-resistor circuit by utilizing only three firing steps as compared with the five firing steps of the prior art. As a result, it is one of the principal objects of the present invention to provide a process which is substantially more efficient in its energy usage, reducing the cost of materials and energy and further reducing the time required to practice the process for producing the article.

Moreover, the furnace which is utilized at lower temperatures for shorter periods of time has a longer useful wear-life, and as a result the system is more energy efficient both in terms of thermal energy required for the process and for utilization of the components of the apparatus over a longer period.

It is a further object of the present invention to reduce as far as possible the number of firing steps required for producing a copper conductor and ruthenium resistor by producing the product in only three steps but without in any way impairing the properties of the resistor circuits.

It is a further important feature of the present invention that the copper conductor material is employed with a frit which is characterized in that it is non-reducible in a hydrogen atmosphere which makes it possible to effect firing of the conductor and bonding thereof to the substrate at a much lower temperature in the order of 850° C. to 950° C., the firing occurring in a furnace for about five to fifteen minutes to establish the adhesion. On the other hand, the printed resistor paint is fired in air at a temperature of 850° C. to 950° C., and the final air-fired copper conductor and resistor are heated in a reducing atmosphere at a temperature of 260° C. to 450° C.

DISCLOSURE OF THE INVENTION

The present invention provides a process and an article forming a thick film copper conductor-resistor circuit. The thick film conductor is produced by first painting a conductive pattern on a substrate by utilizing a copper with a leadless and bismuth free frit which is then fired in atmosphere at approximately 850° C. to 950° C. and for such a period of time that the conductive paste is dried into a conductor pattern with a typical thickness of approximately 0.6 mil to 1.0 mil.

Although the range and thickness of the deposited material can vary, the dry paste, once fired in air, is bonded to the substrate by the glass in the frit, and after such firing, the resistor material in the form of ruthenium oxide or a ruthenate, is painted onto the substrate to form a screen printed resistor network. The resistor material is in the form of a paste deposited on selected portions of the substrate and then dried. The thickness of the resistor layer is variable but generally is in the order of 0.4–1.8 mil thickness. The ruthenium oxide material may vary in composition in accordance with specific examples provided herein.

Generally, the copper paint and the ruthenium oxide paint have a vehicle or screening agent in the weight range of approximately 15 to 35 percent and consisting of a alkyl methacrylate polymer dissolved in a solvent such as pine oil, cellusolve acetate, butyl phthalate or butyl carbitol acetate, etc. The ruthenium oxide or ruthenate paint is then air fired and can be heated to approximately 850° C. to 950° C.

Finally, the entire unit is fired within a reducing atmosphere such as hydrogen and final firing occurs at approximately 260° to 450° C. At this temperature, the oxidized copper is reduced but at these low temperatures, the ruthenium oxide is not appreciably affected by the reducing atmosphere.

A lamination or coating can be disposed over the air-fired resistor prior to the reducing atmosphere firing, although that is not necessary in many if not most applications.

As a result of the foregoing three-step firing process, excellent thick film circuits can be formed having the desirable properties of copper conductors and ruthenium oxide resistor networks, and the whole system obviating the use of expensive precious metal conductor materials such as palladium, silver, gold, etc.

BEST MODE FOR CARRYING OUT THE INVENTION

Figure 1:
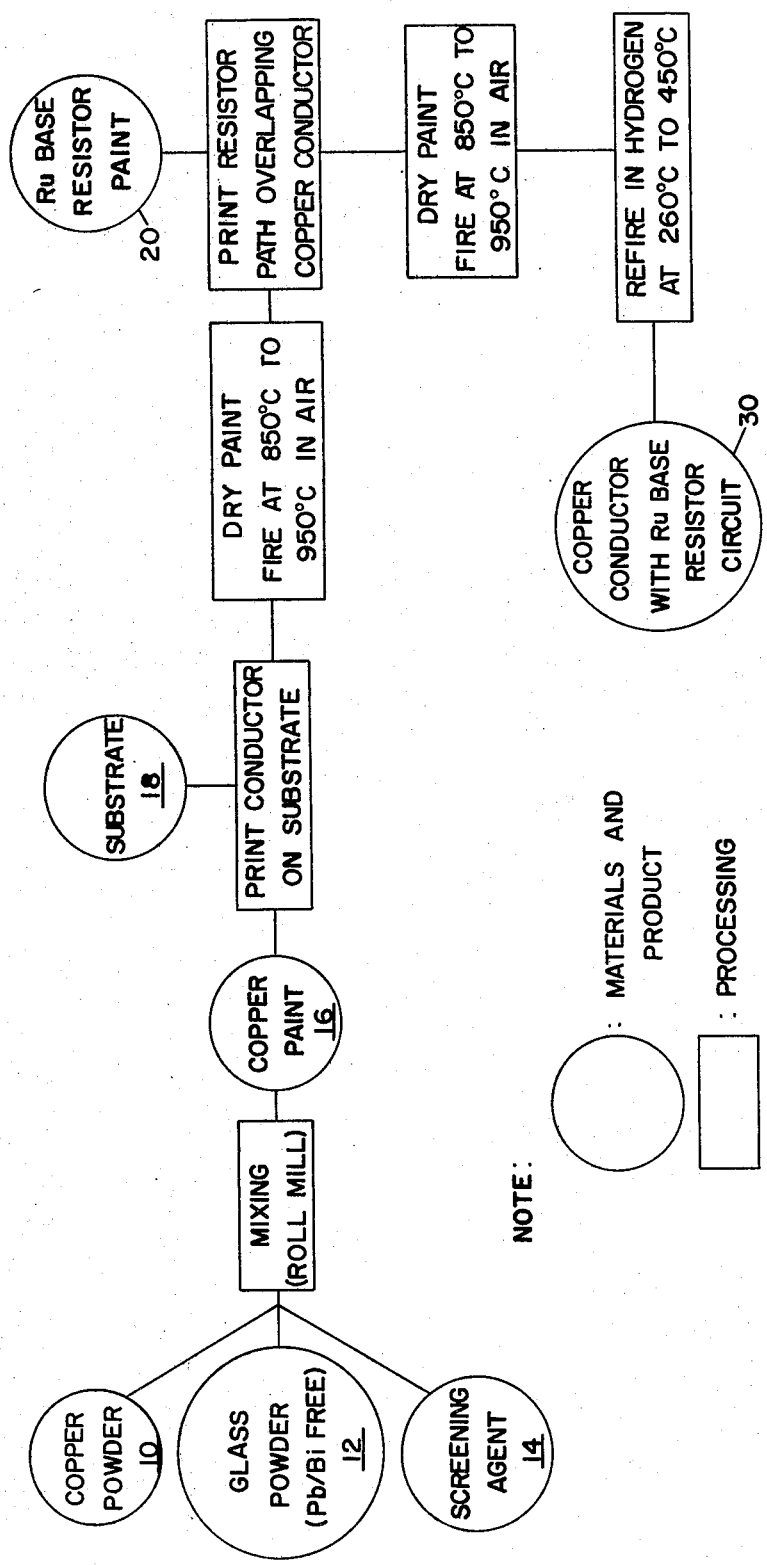
FIG. 1 is a flow diagram of the process utilized in the present invention.
Figure 2:
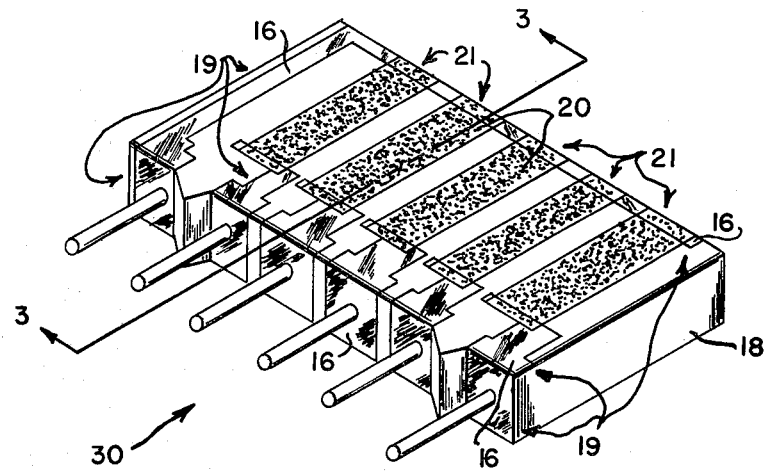
FIG. 2 is an isometric view of a substrate together with a thick film resistor circuit of the present invention.
Figure 3:
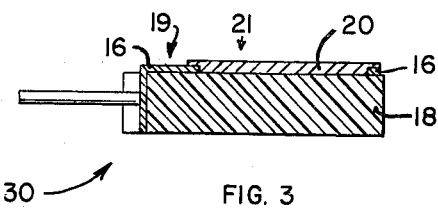
FIG. 3 is a section view taken on line 3—3 of FIG. 2 and with the conductive and resistive paths enlarged for ease of viewing.

Referring to the drawings and particularly to FIGS. 1-3, the method for producing the thick film circuit designated generally by reference numeral 30, includes a substrate 18 consisting typically of alumina.

Generally, the surface of the alumina is prepared by thoroughly cleaning the surface to remove any contaminants which might otherwise interfere with bonding of the conductor and resistor materials to the base.

There is next prepared a conductor material consisting essentially of copper paint 16 made up of three principle constituents—leadless and bismuth free frit 12 having a weight range of not less than 2% to not substantially more than 20% by weight, copper powder 10 in the ranges of not substantially more than 98% to not substantially less than 80%, and a screening agent 14 in the range of approximately 15% to not substantially greater than 35%.

The materials are thoroughly blended together, it being an important part of the present invention that not only is the frit 12 used in conjunction with copper powder 10 but that the frit be virtually lead and bismuth free. In previous compositions, efforts were made to produce a conductor material of copper by totally eliminating the frit but this approach proceeded on the misconception that the frit was an undesirable constituent. On the contrary, frit is found to lend an important property to the copper conductor and it is the presence of lead and bismuth which has been found to be the deleterious agent.

The three main materials described are thoroughly mixed to form a paste or paint 16 of even consistency which is then applied to the substrate 18 through a screen, such material being applied in a conventional manner as for example by means of a squeegee or the like. The conductor paste is applied through a screen having 200 to 325 mesh size and with zero to 1 mil emulsion pattern to produce the conductor pattern.

The copper conductor pattern designated generally by reference numeral 19 and having a thickness of approximately 0.3-1.0 mil is then dried at a temperature of approximately 100° C. for 8-15 minutes and is then air fired.

The firing is done under atmospheric conditions so that the copper material or copper paint 16 on the ceramic substrate 18 becomes an oxide at the firing temperature of 850° C. to 950° C. Firing time is approximately five to fifteen minutes at the end of which the film has been thoroughly dried, fired and bonded to the substrate of alumina.

Proceeding to the next step, there is then printed a resistor paint 20 on the substrate 18, the resistor paint overlapping the air-fired copper conductor pattern 19. The resistor paint is typically a ruthenium oxide or a ruthenate and is painted onto the surface of the alumina to form a resistor network designated generally by reference numeral 21. At the time of application, the thickness of the resistor network after drying is approximately 0.3-1.0 mil.

A type of resistance paint that has been used is a bismuth ruthenium oxide composition obtainable from DuPont and designated as paint No. 1251 and named "Birox." The conductor film is combinable readily in fired conditions with the ruthenium based resistor material although it should be understood that other combinations of resistor materials and conductor materials may be applicable so long as the firing times and temperatures are generally within the range specified herein.

After the resistor network designated generally by reference numeral 21 is deposited, the resistor material 20 is dried at approximately 100° C. to 150° C. and then fired at 850° C. to 950° C. in any conventional manner.

By this time, the copper conductor network 19 is oxidized and it is an important feature of the present invention that the following step will reduce the copper oxide to copper so that it will function as a conductor network but without interfering or substantially affecting the resistance value of the resistance network produced by the ruthenium base resistors.

The final step, as indicated in FIG. 1, is to fire the entire unit now made up of the substrate 18, air-fired copper conductor pattern 19, and resistor network 21, in a reducing atmosphere of hydrogen and at a temperature of 260° C. to 450° C. The effect of firing in a reducing atmosphere at this temperature and time is to reduce the oxidized copper in the conductor pattern.

Figure 4:
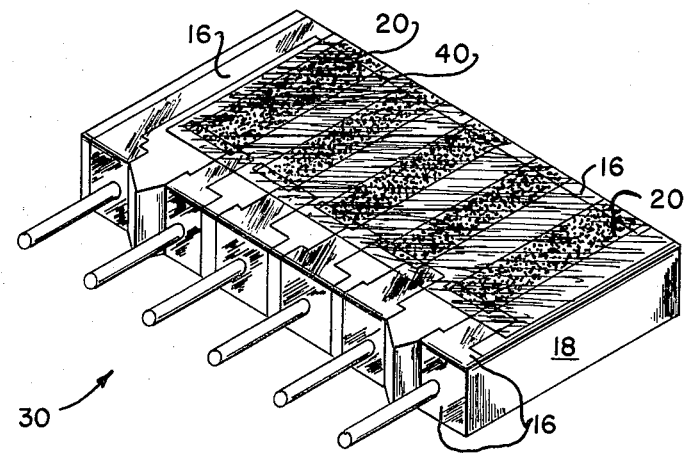
FIG. 4 is an isometric view of a substrate having a thick film resistor network of the present invention wherein the resistance material has been protected by a lamination.

If desired, the resistors can be protected by a lamination 40 (see FIG. 4) which will prevent reduction of the ruthenium base resistors, but this is not always needed and can be employed if so desired.

The resulting product is a thick film circuit 30 of excellent properties comparable functionally with those conductor systems utilizing precious metals, i.e. silver, platinum, gold, palladium, either by themselves or in combination with other materials and utilized in combination with resistor materials such as ruthenium oxide.

The present invention produces a thick film circuit on a substrate but without requiring the precious metal constituents, and without requiring a typical five-step method as taught by the prior art.

Consequently, there is much less energy needed to produce the article and to practice the described process. More efficient utilization of the ovens and heating chambers is obtained because lower temperatures are required, the time involved is decreased, and the total number of steps is reduced drastically.

The invention will become even clearer from a consideration of the following specific working examples.

SELECTED WORKING EXAMPLES

The commercial copper paints such as DuPont #9922 and #9923 which are suitable for firing in an inert atmosphere such as in nitrogen, cannot be fired under hydrogen because of the loss of adhesion between the copper film and the substrate. Generally, the commercial copper conductors contain substantial quantities of PbO and/or $Bi_2O_3$ which are useful for making low softening-point glasses and improving the solderability, but which are unstable in atmospheres of low oxygen content. In order to make reasonable low softeningpoint frit without PbO and/or $Bi_2O_3$, the borate or borosilicate glasses containing the alkaline earths (Ba, Sr, Ca, Mg) are stable under the required conditions and may be utilized. Alumina may be included in these glasses to improve chemical durability and inhibit devitrification. Other non-reducible oxides under hydrogen conditions may also be employed such as $Na_2O$, $K_2O$, $Li_2O$, ZnO, etc.

The screening agent for making the copper paint is preferably an alkyl methacrylate polymer or copolymer. The common resin used for making thick film paints is ethyl cellulose. The alkyl methacrylate polymers or copolymers yield the best results. The solvents for the resin can be typically pine oil, cellusolve acetate, butyl phthalate, or butyl carbitol acetate, etc.

The following examples and comparisons are presented as illustrative of the invention. The glass frits are lead and bismuth free and all the inorganic materials used in these experiments had an average particle size in the range 0.5 to 10 microns. Typical of the screening agents used in the examples is methacrylate polymer dissolved in pine oil. The percentage of screening agent in the paint is about 15 to 35% depending upon the viscosity required for application. The amount of materials in the following examples is in weight percent.

The glass frits used for making copper paints are listed in Table I.

TABLE I

| Glass Constituent | GLASS FRIT COMPOSITIONS (By Weight) | | | | |
| --- | --- | --- | --- | --- | --- |
| | Glass A | Glass B | Glass C | Glass D | Glass E |
| $SiO_2$ | 25 | 5 | 33.5 | 15 | 20 |
| $B_2O_3$ | 25 | 40 | 17.4 | 30 | 20 |
| $Na_2CO_3$ | 20 | 10 | 9.4 | 15 | 20 |
| $Li_2CO_3$ | 5 | — | 9.5 | 15 | 20 |
| BaO | 5 | — | — | — | — |
| CuO | 3 | — | — | — | — |
| ZnO | 4 | 40 | — | 5 | — |
| $Al_2O_3$ | 5 | 5 | 22.8 | 5 | 5 |
| $TiO_2$ | 8 | — | — | — | — |
| $MgCO_3$ | — | — | 7.4 | 5 | 5 |
| $CaCO_3$ | — | — | — | 10 | 10 |

The test results from the copper paints made from the glass frits listed in Table I are shown in Tables II, III and IV.

TABLE II

| | 1 | 2 950° C. in Air | | | 3 Refire at 370° C., 93% $N_2$/7% $H_2$ | | |
| --- | --- | --- | --- | --- | --- | --- | --- |
| | Cu/Glass Ratio | Color | Ω/□ | Adhesion | Color | Ω/□ | Adhesion |
| Paint 1 | 85 Cu/15 Glass A | Gray Black | >1 meg ohm | Good | Copper | 0.016 | Good |
| Paint 2 | 85 Cu/15 Glass B | Gray Black | >1 meg ohm | Good | Copper | 0.013 | Good |
| Paint 3 | 85 Cu/15 Glass C | Gray Black | >1 meg ohm | Good | Copper | 0.013 | Good |
| Paint 4 | 85 Cu/15 Glass D | Gray Black | >1 meg ohm | Very Good | Copper | 0.02 | Very Good |
| Paint 5 | 85 Cu/15 Glass E | Gray Black | >1 meg ohm | Very Good | Copper | 0.02 | Very Good |
| Paint 6 | 80 Cu/20 Glass D | Gray Black | >1 meg ohm | Very Good | Copper | 0.04 | Very Good |
| Paint 7 | 80 Cu/20 Glass E | Gray Black | >1 meg ohm | Very Good | Copper | 0.04 | Very Good |
| Paint 8 | 90 Cu/10 Glass D | Gray Black | >1 meg ohm | Very Good | Copper | 0.016 | Very Good |
| Paint 9 | 90 Cu/10 Glass E | Gray Black | >1 meg ohm | Very Good | Copper | 0.016 | Very Good |

TABLE III

| | 1 | 2 850° C. in Air | | 3 Refire at 310° C. 93% $N_2$/7% $H_2$ | | |
| --- | --- | --- | --- | --- | --- | --- |
| | | Color | Adhesion | Color | Ω/□ | Adhesion |
| Paint 11 | 100 Cu/No Glass | Gray | Very Poor | Copper | 0.005 | Very Poor |
| Paint 1 | 85 Cu/15 Glass A | Gray Black | Good | Copper | 0.02 | Good |
| Paint 2 | 85 Cu/15 Glass B | Gray Black | Good | Copper | 0.018 | Good |
| Paint 4 | 85 Cu/15 Glass D | Gray Black | Good | Copper | 0.025 | Good |

| | 1 | 2 950° C. in Air | | 3 Refire at 310° C. 93% $N_2$/7% $H_2$ | | |
| --- | --- | --- | --- | --- | --- | --- |
| | | Color | Adhesion | Color | Ω/□ | Adhesion |

TABLE III-continued

| Paint 11 | 100 Cu/No Glass | Gray | Poor | Copper | 0.006 | Poor |
| Paint 1 | 85 Cu/15 Glass A | Gray Black | Very Good | Copper | 0.019 | Very Good |
| Paint 2 | 85 Cu/15 Glass B | Gray Black | Very Good | Copper | 0.015 | Very Good |
| Paint 4 | 85 Cu/15 Glass D | Gray Black | Very Good | Copper | 0.021 | Very Good |

Paint 11 is a fritless copper paint used for comparison, and as can be seen from the Table III, the adhesion is poor after firing at either 850° C. or 950° C. in air for ten minutes.

TABLE IV

| | 1 | 2 950° C. in Air | 3 Refire at 370° C. 93% N$_2$/7% H$_2$ | | | |
|---|---|---|---|---|---|---|
| | Cu/Glass Ratio | Adhesion | Color | Ω/□ | Adhesion | Solderability |
| Paint 12 | 98 Cu/2 Glass D | Good | Copper | 0.011 | Good | Good |
| Paint 13 | 96 Cu/4 Glass D | Good | Copper | 0.011 | Good | Good |
| Paint 14 | 94 Cu/6 Glass D | Good | Copper | 0.012 | Good | Fair/Good |
| Paint 15 | 92 Cu/8 Glass D | Good | Copper | 0.012 | Good | Fair/Good |

The minimum temperature required to reduce the oxidized copper to a copper conductor is 260° C., and the minimum amount of hydrogen required is 2%.

The particular resistor paint was made from bismuth-ruthenium oxide, designated as "Birox" by the DuPont Company. After the resistor paint was printed on the substrate to overlap the air-fired copper paint #12 in Table IV and dried at 125° C. for ten minutes, and then fired in air at 850° C. for about ten minutes, as recommended by DuPont in order to achieve a sheet resistance of 100 k ohms per square, the whole unit when refired in 93%N$_2$/7%H$_2$ atmosphere at 370° C. for 20 minutes yielded a sheet resistance of 100 k ohms per square.

The commercial ruthenium base resistor formulations in which reducing agents have no effect on the properties of resistance are described in a paper presented at the 1972 Electronic Components Conference by Cermalloy Division of Bala Electronics Corporation and entitled "*Characteristics of a High Performance 50 ppm Resistor Systems.*" In the 1972 Electronic Components Conference paper, the Cermalloy ruthenium resistor system changes 0.1 to 0.3% after exposure to a 85%N$_2$/15%H$_2$ forming gas for 24 hours at 375° C.

The Engelhard ruthenium resistor system designated as A3005, A3006 and A3107 has been refired by 93%N$_2$/7%H$_2$ at 350° C. for 15 minutes, and the resistance changes are less than 0.2% in average; and at 400° C. for 15 minutes, the resistance changes are 0.5, 0.7 and 1.5%, respectively. These changes are not greater than expected for the same treatment in air as described by Cermalloy in the 1972 publication.

OPERATION

In operation, the alumina substrate 18 is first cleaned, the frit-copper-screening agent paint 16 is then mixed to an even constituency, the frit 12 being virtually lead and bismuth free as previously described, and the paste is then screened onto the substrate and fired to form a conductor network 19.

Next, the resistor network 21 is screened onto the substrate, typically the resistor network consisting of ruthenium oxide, or ruthenates and the resistor network is then dried and bonded to the substrate by firing at approximately 850° C. to 950° C.

Thereafter, the combination is heated in a reducing atmosphere to a relatively low temperature of 260° C. to 450° C. at which time the oxidized copper is reduced and the characteristic black color becomes a burnished red color indicating elemental copper which characteristically has good conductive properties. The resulting product is a thick film circuit 30 of excellent properties, and the primary goal of eliminating the usage of precious metals has been attained.

Another important feature of the present invention is that silver metals tend to migrate or disperse under heating; there is no such short coming in the present invention where copper is the functional conductive material.

Unlike the prior art, the copper does include glass frit, the frit being virtually lead and bismuth free, and the described process provides fabrication modes which require only one reducing atmosphere which renders in one step the oxidized copper into a suitable conductive state.

INDUSTRIAL APPLICABILITY

The invention is used in producing thick film resistor circuits and pertains further to the mode of producing such circuits.

CONCLUSION

Although the present invention has been illustrated and described in connection with selected example embodiments it will be understood that these are illustrative of the invention and are by no means restrictive thereof. It is reasonably to be expected that those skilled in the art can make numerous revisions and adaptations of this invention and it is intended that such revisions and adaptations will be included within the scope of the following claims as equivalents of the invention.

I claim:

1. A thick film circuit bonded to a nonconductive substrate comprising a copper-and-frit mixture conductor applied to said substrate, said copper-and-frit mixture conductor comprising the reaction product of a mixture of copper and essentially pure, deleterious metal free glass frit fired in air at a temperature of about 850° C. to 950° C. to bond said mixture to the substrate with the glass frit serving as an intermediate bonding agent, and a resistive path disposed upon said copper-and-frit mixture conductor and said substrate, the resistive path being the reaction product of an oxidizable resistive material air-fired at a temperature of 850° C. to 950° C. subsequently to the firing of said mixture of copper and frit, said resistive path and copper-and-frit mixture conductor being the conjoint reaction product of heating the oxidized resistive path and copper-and-frit mixture conductor in a reducing atmosphere subsequently to the firing of said resistive path.

2. The thick film circuit in accordance with claim 1, wherein the resistive path and conductor are the reaction products of heating in a reducing atmosphere at a temperature of about 260° C. to 450° C.

3. The thick film circuit in accordance with claim 1, wherein the resistive material comprises ruthenium oxide.

4. The thick film circuit in accordance with claim 1, wherein the resistive material comprises a ruthenate.

5. The thick film circuit in accordance with claim 1, further including a protective lamination formed over said resistor path.

6. The thick film circuit in accordance with claim 1, wherein the conductor is the reaction product of (a) a lead-free and bismuth-free frit in the weight range of 2–20 percent (b), copper powder in the weight range of 80–98 percent, and (c) a screening agent in the range of about 15–35 percent by weight of the entire mixture.

7. The thick film circuit in accordance with claim 1, wherein the conductor is formed by firing at peak temperature for a period of about five to fifteen minutes.

8. The thick film circuit in accordance with claim 1, wherein the resistive path and copper conductor are the conjoint reaction product of firing in a reducing atmosphere of 2% to 100% hydrogen.

* * * * *